US007477087B2

(12) United States Patent
Kapusta, Jr.

(10) Patent No.: US 7,477,087 B2
(45) Date of Patent: Jan. 13, 2009

(54) SWITCH-CAPACITOR TECHNIQUES FOR LEVEL-SHIFTING

(75) Inventor: Ronald A. Kapusta, Jr., Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 153 days.

(21) Appl. No.: 11/514,091

(22) Filed: Aug. 31, 2006

(65) Prior Publication Data

US 2008/0061857 A1 Mar. 13, 2008

Related U.S. Application Data

(60) Provisional application No. 60/813,553, filed on Jun. 14, 2006.

(51) Int. Cl.
*G06F 7/64* (2006.01)
*G06G 7/18* (2006.01)
*G06G 7/19* (2006.01)

(52) U.S. Cl. ........................ 327/337; 327/148; 327/157

(58) Field of Classification Search ................. 327/108, 327/112, 533, 91, 94, 337, 148, 157
See application file for complete search history.

(56) References Cited

U.S. PATENT DOCUMENTS 5,847,601 A 12/1998 Wang

OTHER PUBLICATIONS

Allen, P. and Holberg, D., *CMOS Analog Circuit Design*, New York: HRW, 1987, pp. 509-511.

(Continued)

*Primary Examiner*—Tuan T Lam
*Assistant Examiner*—Daniel Rojas
(74) *Attorney, Agent, or Firm*—Wolf, Greenfield & Sacks, P.C.

(57) ABSTRACT

In one embodiment, a circuit comprises at least first and second circuit stages, at least one level shifting circuit, and a control circuit. The first circuit stage is configured and arranged to produce a reference voltage at the at least one first output during each first phase of at least first and second phases, and to produce an output signal at the at least one first output that is responsive to an input signal at the at least one first input during each second phase of the at least first and second phases. The at least one level shifting circuit comprises at least one capacitor and at least one switch and is coupled between the first circuit stage and the second circuit stage. The control circuit is configured to control the level shifting circuit such that, during each first phase, respective plates of the at least one capacitor are connected to the at least one first output of the first circuit stage and a source of a substantially constant voltage so as to allow the at least one capacitor to be charged to a level-shift voltage equal to a difference between the substantially constant voltage and the reference voltage, and such that, during each second phase, the respective plates of the at least one capacitor are connected to the at least one first output and the at least one second input to thereby introduce the level-shift voltage across the at least one capacitor as an offset voltage therebetween.

20 Claims, 11 Drawing Sheets

954 Control Circuit $\Phi_1$ $\Phi_2$
$V_{DD}$ 904
902a 923a 920a Desired PMOS Gate Voltage $\Phi_1$ 921a 921b 920b 923b 902b Desired PMOS Gate Voltage
$C_{LSAP}$ $C_{LSBP}$
906a 912a Reference Voltage $\Phi_1$ 912b 906b Reference Voltage
Input+ 916a 910a $\Phi_2$ Output− Output+ 910b $\Phi_2$ Input− 916b
$C_{LSAN}$ $C_{LSBN}$
908a 914a Desired NMOS Gate Voltage $\Phi_1$ 918a 918b 914b 908b Desired NMOS Gate Voltage
$V_{SS}$

OTHER PUBLICATIONS

Fayomi, C.J.B., et al., "A Design Strategy for a 1-V Rail-to-Rail Input/Output CMOS Opamp," *2001 Int. Symposium on Circuits and Systems*, vol. 1, pp. 639-642.

Giustolisi, G., et al., "1.2-V CMOS Op-Amp with a Dynamically Biased Output Stage." *IEEE Journal of Solid-State Circuits*, vol. 35, No. 4, pp. 632-636, Apr. 2000.

Gray, P. et al., *Analysis and Design of Analog Integrated Circuits*, New York: John Wiley, 2001, p. 363-365.

Hosticka, B., "Dynamic CMOS Amplifiers," *IEEE Journal of Solid-State Circuits*, vol. SC-15, No. 5, pp. 887-894, Oct. 1980.

Palmisano, G. and Pennisi, S., "Dynamic Biasing for True Low-Voltage CMOS Class AB Current-Mode Circuits," *IEEE Trans. on Circuits and Systems*, vol. 47, No. 12, pp. 1569-1575, Dec. 2000.

1201
Stage 1
1205a
1205b
$\Phi_1$
-A
1207
1216a
1216b
Input+
Input-
1254
Control Circuit
$\Phi_1$
1202a
Desired PMOS Gate Voltage
1223a
Desired NMOS Gate Voltage
1208a
1220a
1214a
$C_{LSAP}$
$C_{LSAN}$
1203
Stage 2
$V_{CC}$
$V_{SS}$
1221a
1221b
1218a
1218b
Output-
Output+
1202b
Desired PMOS Gate Voltage
1223b
Desired NMOS Gate Voltage
1208b
1220b
1214b
$C_{LSBP}$
$C_{LSBN}$

SWITCH-CAPACITOR TECHNIQUES FOR LEVEL-SHIFTING

This application claims the benefit of U.S. Provisional Application Ser. No. 60/813,533, filed on Jun. 14, 2006, the entire contents of which is incorporated herein by reference.

BACKGROUND

One of the major difficulties in moving towards higher A/D conversion rates is the decreased available settling time for amplifiers. In older process generation designs, linear behavior dominates amplifier settling. Due to higher transition frequency ($f_T$) transistors in deep sub-micron complementary metal oxide semiconductor (CMOS) layouts, slew behavior can dominate.

Amplifiers that employ "push-pull," or "class AB," topologies can efficiently achieve high-speed settling while driving large capacitive loads. FIGS. 1 and 2 are diagrams of prior art circuits employing, respectively, a common-source push-pull topology and a common-drain push-pull topology. An advantage of push-pull amplifiers like those shown is that a large transient current can be made available without consuming a large standing current. Such push-pull amplifiers can be made efficient by introducing a level-shift between the nominal input voltage and the desired gate voltages. In the circuits of FIGS. 1 and 2, voltage sources 102 and 104 are employed to introduce bias voltages $V_{BIAS,\ P}$ and $V_{BIAS,\ N}$, respectively, between the input node 106 and the gates of the amplifier's complementary transistors. As illustrated in FIG. 3, this type of level-shifting can also be applied to other amplifier topologies, such as a level-shifted Class A amplifier.

Active level-shifting between the input voltage and gate voltages has been proposed in Gray, P. et al., *Analysis and Design of Analog Integrated Circuits*, New York: John Wiley, 2001, p. 364, which is incorporated herein by reference in its entirety. In CMOS technologies, switched-capacitor level shifting, such as that illustrated in FIG. 4, has also been used. Examples of such uses are described in Allen, P. and Holberg, D., *CMOS Analog Circuit Design*, New York: HRW, 1987, pp. 509-511; Hosticka, B., "Dynamic CMOS Amplifiers," *IEEE J. Solid-State Circuits*, vol. SC-15, pp. 887-894, October 1980; Palmisano, G. and Pennisi, S., "Dynamic Biasing for True Low-Voltage CMOS Class AB Current-Mode Circuits," *IEEE Trans. on Circuits and Systems*, vol. 47, pp. 1569-1575, December 2000; Fayomi, C. J. B. et al, "A design strategy for a 1-V rail-to-rail input/output CMOS opamp," 2001 *Int. Symposium on Circuits and Systems*, vol. 1, pp. 639-642, each of which is incorporated herein by reference in its entirety.

In the example of FIG. 4, charged capacitors 402, 404 are selectively connected between the input node 406 and the gates of complementary transistors 408, 410. Switched-capacitor level-shifting thus allows direct connections between the input and high impedance nodes (transistor gates in the illustrated example). Compared to active level-shifting, switched-capacitor level-shifting is power efficient and eliminates parasitic poles in the signal path.

In order to employ capacitive level-shifting, the proper charge needs to be applied to the level-shift capacitors 402, 404. One previously used technique for applying such charge is shown in FIG. 5. In this configuration, a charge-refreshing capacitor $C_{REF}$ is used to supply the needed charge on a level-shift capacitor $C_{LS}$. In particular, during a first phase $\Phi_1$, switches 502, 504 are closed and switches 505, 507 are opened, thus allowing charge from the charge-refreshing capacitor $C_{REF}$ to be transferred to level-shift capacitor $C_{LS}$. During a second phase $\Phi_2$, the switches 502, 504 are opened and the switches 505, 507 are closed, so that the voltage on the level-shift capacitor $C_{LS}$ is introduced between the input node 510 and the gate of NMOS transistor 512, and the charge-refreshing capacitor $C_{REF}$ is recharged when its plates are connected to a reference voltage node 506 and a bias voltage node 508.

SUMMARY OF THE INVENTION

According to one aspect of the present invention, a method involves providing a circuit comprising at least first and second circuit stages and a first level-shift capacitor, each of the first and second circuit stages comprising at least one input, at least one output, and at least one signal processing element coupled therebetween. At least one signal is received that defines at least first and second phases. A first circuit node is provided having a first substantially constant voltage thereon at least during the first and second phases, wherein the first substantially constant voltage remains substantially constant when a significant amount of charge is transferred between the first circuit node and the first level shift capacitor during a first phase, and a second circuit node is provided having a first reference voltage thereon at least during the first phases. During each first phase, the circuit is configured such that respective plates of the first level-shift capacitor are connected to the first and second circuit nodes, thereby allowing the first level-shift capacitor to charge to a level-shift voltage equal to a difference between the first substantially constant voltage and the first reference voltage. During each second phase, the circuit is configured such that the respective plates of the first level-shift capacitor are connected to a first output of the first circuit stage and a first input of the second circuit stage, without causing the first level-shift capacitor to be connected in parallel with another capacitor with which it was not connected in parallel during a preceding first phase, thereby introducing the voltage across the first level-shift capacitor as an offset voltage between the first and second circuit stages.

According to another aspect, a method involves providing a circuit comprising at least first and second circuit stages and a first level-shift capacitor, wherein each of the first and second circuit stages comprises at least one input, at least one output, and at least one signal processing element coupled therebetween, and wherein the at least one output of the second circuit stage is connected to a load. At least one signal is received that defines at least first and second phases. A first circuit node is provided having a first substantially constant voltage thereon at least during the first phases, wherein the first substantially constant voltage remains substantially constant when a significant amount of charge is transferred between the first circuit node and the first level-shift capacitor during a first phase, and wherein the at least one output of the second circuit stage remains connected to the load when the first substantially constant voltage is established on the first node during the first phases. A second circuit node is provided having a first reference voltage thereon at least during the first phases. During each first phase, the circuit is configured such that respective plates of the first level-shift capacitor are connected to the first and second circuit nodes, thereby allowing the first level-shift capacitor to charge to a level-shift voltage equal to a voltage difference between the first substantially constant voltage and the first reference voltage. During each second phase, the circuit is configured such that the respective plates of the first level-shift capacitor are connected to a first output of the first circuit stage and a first input of the second circuit stage, without causing the first level-shift capacitor to be connected in parallel with another capacitor with which it was not connected in parallel during a preceding first phase, thereby introducing the voltage across the first level-shift capacitor as an offset voltage between the first and second circuit stages.

According to another aspect, a circuit comprises at least first and second circuit stages, at least one level shifting circuit, and a control circuit. The first circuit stage comprises at least one first input, at least one first output, and at least one first signal processing element coupled therebetween, and is configured and arranged to produce a reference voltage at the at least one first output during each first phase of at least first and second phases, and to produce an output signal at the at least one first output that is responsive to an input signal at the at least one first input during each second phase of the at least first and second phases. The second circuit stage comprises at least one second input, at least one second output, and at least one second signal processing element coupled therebetween. The at least one level shifting circuit comprises at least one capacitor and at least one switch and is coupled between the first circuit stage and the second circuit stage. The control circuit is configured to control the level shifting circuit such that, during each first phase, respective plates of the at least one capacitor are connected to the at least one first output of the first circuit stage and a source of a substantially constant voltage so as to allow the at least one capacitor to be charged to a level-shift voltage equal to a difference between the substantially constant voltage and the reference voltage, and such that, during each second phase, the respective plates of the at least one capacitor are connected to the at least one first output and the at least one second input to thereby introduce the level-shift voltage across the at least one capacitor as an offset voltage therebetween.

According to another aspect, a method involves providing a circuit comprising first and second circuit stages, and first, second, third, and fourth level-shifting capacitors, wherein each of the first and second circuit stages comprises at least one input, at least one output, and at least one signal processing element coupled therebetween, and wherein the second circuit stage comprises first and second differential inputs. At least one signal is received that defines at least first and second phases. First and second circuit nodes are provided having substantially constant voltages thereon at least during the first phases, and third and fourth circuit nodes are provided having reference voltages thereon at least during the first phase. During each first phase, the circuit is configured such that (1) respective plates of the first level-shift capacitor are connected to the first and third circuit nodes, (2) respective plates of the second level-shift capacitor are connected to the second and fourth voltage nodes, (3) respective plates of the third level-shift capacitor are connected to an output of the first circuit stage and the first differential input of the second circuit stage, and (4) respective plates of the fourth level-shift capacitors are connected to an output of the first circuit stage and the second differential input of the second circuit stage. During each second phase, the circuit is configured such that (1) respective plates of the third level-shift capacitor are connected to the first and third circuit nodes, (2) respective plates of the fourth level-shift capacitor are connected to the second and fourth voltage nodes, (3) respective plates of the first level-shift capacitor are connected to an output of the first circuit stage and the first differential input of the second circuit stage, and (4) respective plates of the second level-shift capacitors are connected to an output of the first circuit stage and the second differential input of the second circuit stage.

DETAILED DESCRIPTION

Figure 2:
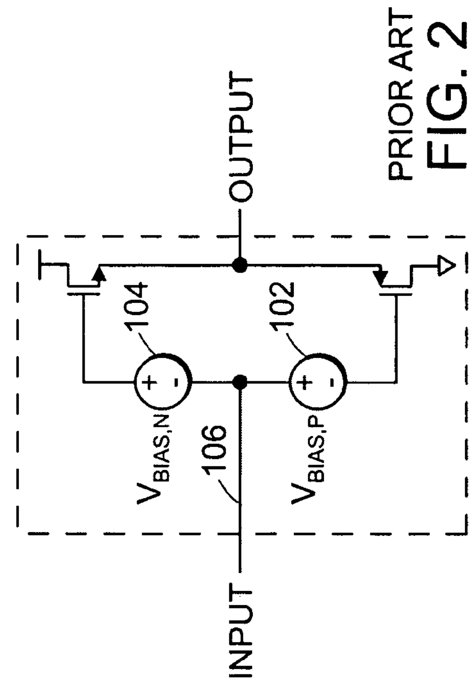
FIG. 2 is a diagram of a prior art amplifier circuit employing a class AB common-drain topology.
Figure 1:
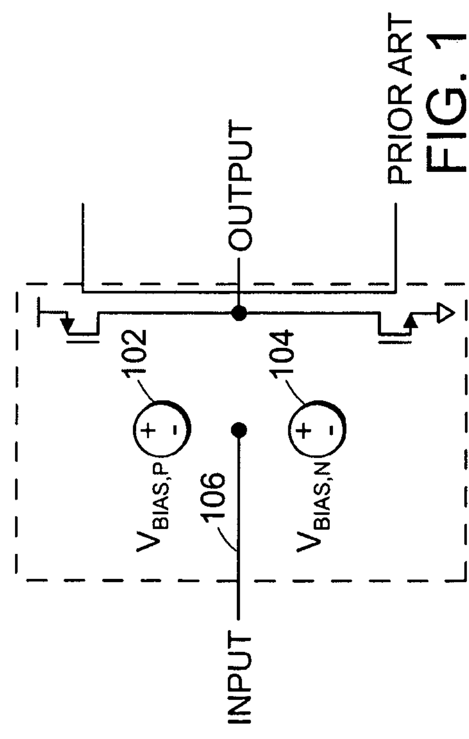
FIG. 1 is a diagram of a prior art amplifier circuit employing a class AB common-source topology.
Figure 4:
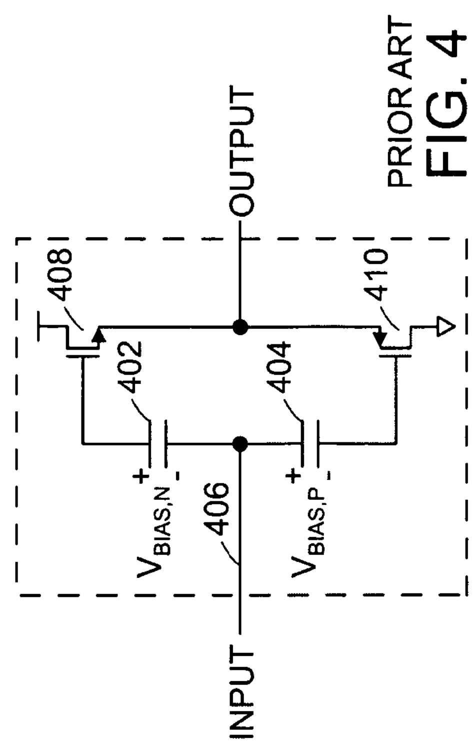
FIG. 4 is a diagram of a prior art amplifier circuit employing a capacitive level-shifted class AB common-drain topology.
Figure 3:
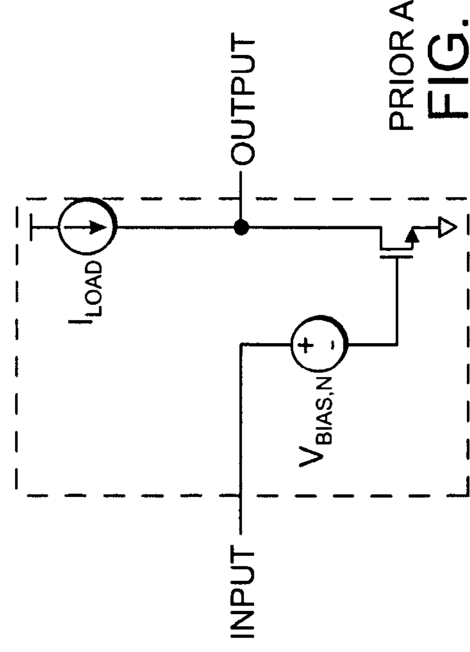
FIG. 3 is a diagram of a prior art amplifier circuit employing a level-shifted class A common-source topology.
Figure 5:
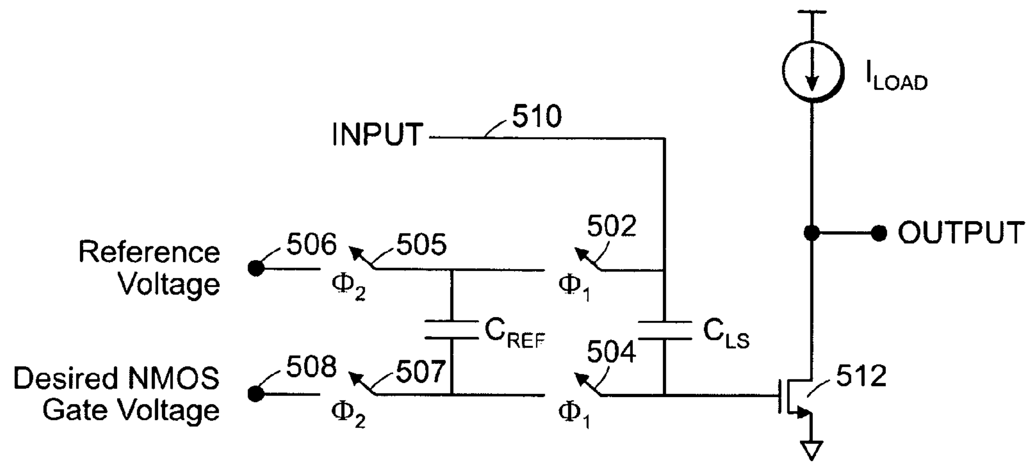
FIG. 5 is a diagram of a prior art amplifier circuit employing a switched-capacitor technique for biasing a level-shift capacitor in a class A common-source topology.

A problem with the prior art technique illustrated in FIG. 5 is that certain disturbances in the charge on level-shift capacitor $C_{LS}$ may not be completely fixed in the next phase. That is, during each phase $\Phi_1$, the closing of the switches 502, 504 and opening of the switches 505, 507 merely allows the charges on capacitors $C_{REF}$ and $C_{LS}$ to balance out. That means that the voltage on the level-shift capacitor $C_{LS}$ can be altered only incrementally by an amount dependent on the ratio of the two capacitance values. It can thus take many clock cycles in order for the charge-refreshing capacitor $C_{REF}$ to adequately correct any errors in the charge on the level-shift capacitor $C_{LS}$. The time required for disturbance recovery is thus a function of the ratio between the values of the charge-refreshing capacitor $C_{REF}$ and the level-shift capacitor $C_{LS}$, as well as the required accuracy.

This slow recovery can be problematic in high-speed amplifiers, and can be particularly troublesome in applications where the recovery time is longer than the time constant of the signals being processed. Furthermore, if the disturbance is signal dependent, such as feedthrough from the output node through the gate-drain overlap capacitance, such a circuit can exhibit a memory effect from one clock cycle to the next.

Several different and improved circuits and techniques for biasing one or more level-shift capacitors are disclosed herein. In some embodiments, use of these new techniques can allow the level-shift capacitor(s) to recover from any disturbance within one clock cycle.

Figure 6:
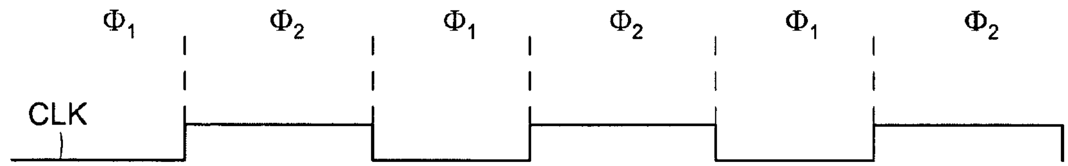
FIGS. 6 and 7 are timing diagrams illustrating examples of signals that may be used to control switches in the various embodiments described herein.
Figure 7:
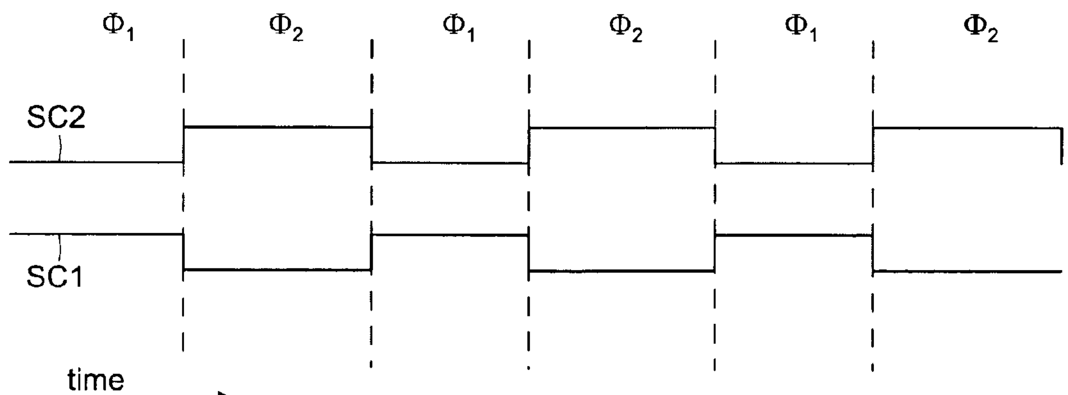

Any of a number of clocking schemes may be employed to establish the various phases and control the various switches discussed herein. A few examples of suitable clocking techniques are shown in FIGS. 6 and 7. As shown in FIG. 6, in some embodiments, a single clock signal CLK may be used to establish non-overlapping phases $\Phi_1$ and $\Phi_2$ and to control all of the switches in the circuit. In such embodiments, for example, switches that are closed in response to a logical low signal may be employed as the phase $\Phi_1$ switches, and switches that are closed in response to a logical high signal may be employed as the phase $\Phi_2$ switches. Alternatively, as shown in FIG. 7, separate clock signals SC1 and SC2 may be employed to control the phase $\Phi_1$ switches and the phase $\Phi_2$ switches, respectively, in which case switches that are closed in response to the same logical signal level may be used throughout the circuit. In some embodiments, phases in addition two phases $\Phi_1$ and $\Phi_2$ may also be established, and the two described phases $\Phi_1$ and $\Phi_2$ may be a subset of a larger number of phases employed in a system.

Figure 8:
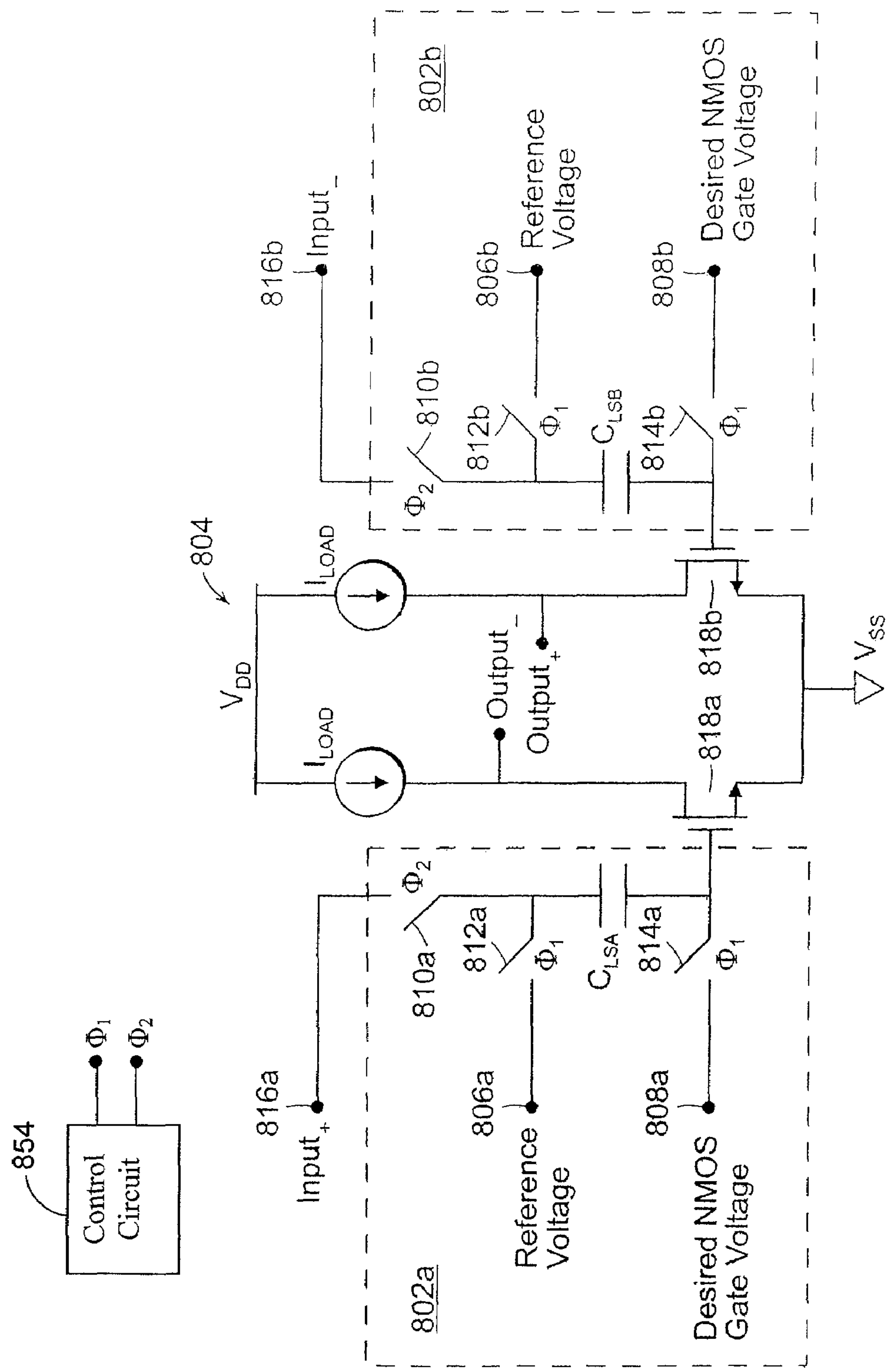
FIG. 8 is a diagram illustrating an example of an inventive switched-capacitor circuit and technique for biasing a pair of level-shift capacitors in a differential amplifier circuit employing a class A common-source topology.

FIG. 8 illustrates one example of an inventive level-shifting circuit 802. In the example shown, the level-shifting circuits 802*a*, 802*b* are used to provide level shifts for the differential inputs of a class A common-source amplifier 804. Input nodes 816*a*, 816*b* may, for example, be connected to respective outputs of a preceding amplifier stage (not shown in FIG. 8). As discussed in more detail below, however, the level-shifting circuit 802, as well as the other level-shifting circuits disclosed herein, may alternatively be used in any of a number of other environments to introduce a level shift to any of a number of other devices, and the invention is not necessarily limited to any particular application.

In the example shown, during each phase $\Phi_1$, switches 810*a*, 810*b* are opened so that level-shift capacitors $C_{LSA}$ and $C_{LSB}$ are disconnected from the positive and negative input nodes 816*a*, 816*b*, and the switches 812*a*, 812*b*, 814*a*, 814*b* are closed so that the plates of the level-shift capacitors $C_{LSA}$ and $C_{LSB}$ are connected to reference voltage nodes 806*a*, 806*b* and bias voltage nodes 808*a*, 808*b*. The nodes 806*a*, 806*b*, 808*a*, 808*b* may, for example, be connected to outputs of voltage sources that generate substantially constant voltages regardless of the loads attached thereto and the amount of charge transferred to or from the level-shift capacitors $C_{LSA}$, $C_{LSB}$. The nodes 806*a*, 806*b*, 808*a*, 808*b* may either be connected to separate voltage sources or to a shared voltage source, depending on the layout and desired characteristics of the circuit. Connecting the level-shift capacitors $C_{LSA}$, $C_{LSB}$ across the nodes 806*a*, 806*b*, 808*a*, 808*b* thus sets the proper charge on the level-shift capacitors $C_{LSA}$, $C_{LSB}$ during the phase $\Phi_1$. During each phase $\Phi_2$, the switches 810*a*, 810*b* are closed and the switches 812*a*, 812*b*, 814*a*, 814*b* are opened, so that level-shift capacitors $C_{LSA}$, $C_{LSB}$ are connected back to the input nodes 816*a*, 816*b*, and act as batteries that force the correct bias voltages on the gates of NMOS transistors 818*a*, 818*b* of the differential amplifier 804 for inputs that are equal to the reference voltages.

Accordingly, during each phase $\Phi_1$, the charge on each of the level-shift capacitors $C_{LSA}$, $C_{LSB}$ can be completely restored to the intended value, and, if an error is introduced onto either of the level-shift capacitors $C_{LSA}$, $C_{LSB}$ during a phase $\Phi_2$, it will be removed during the subsequent phase $\Phi_1$ and will not affect the following phase $\Phi_2$.

Figure 9:
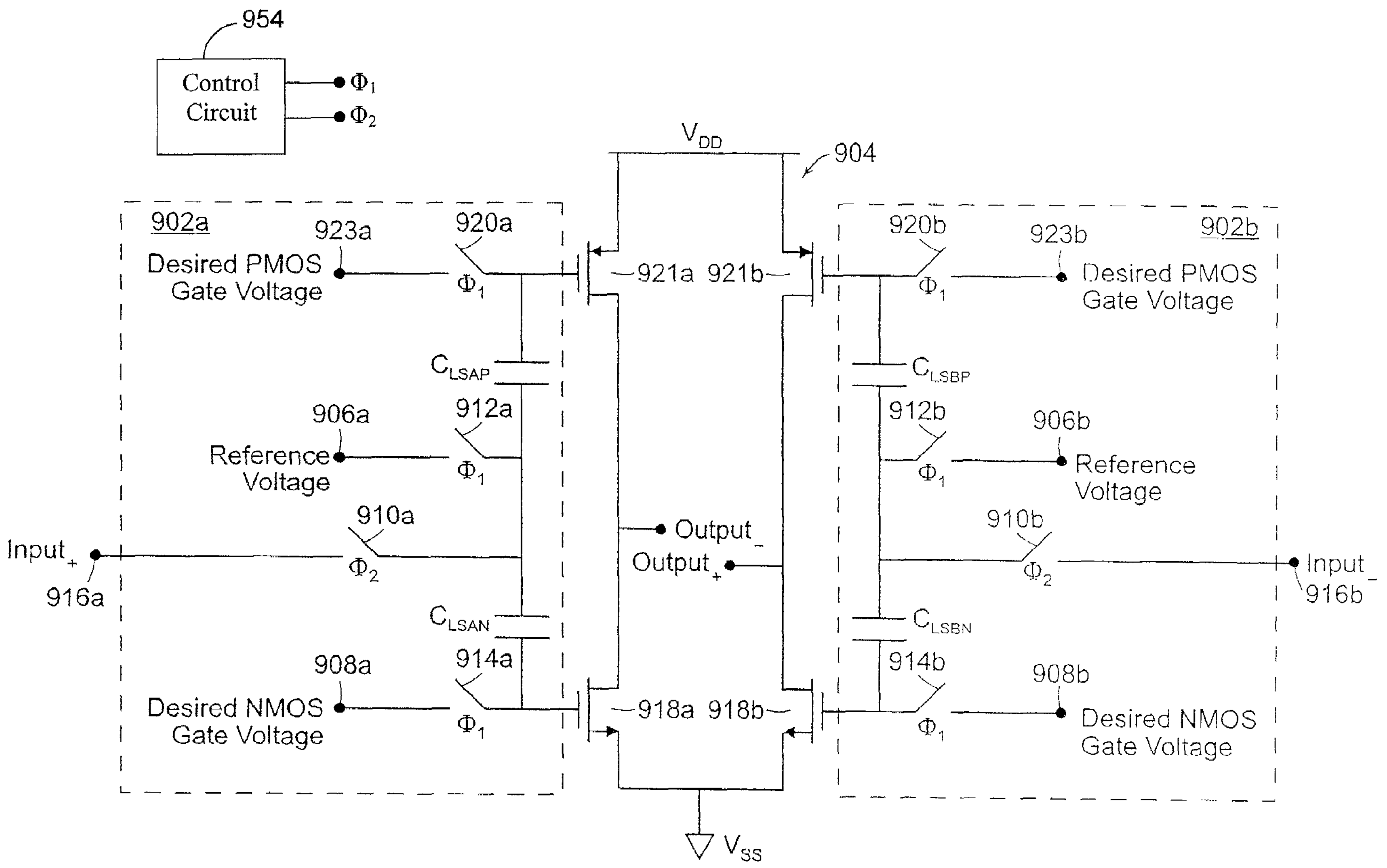
FIG. 9 is a diagram illustrating an example of an inventive switched-capacitor circuit and technique for biasing four separate level-shift capacitors in a differential amplifier circuit employing a class AB common-source topology.

FIG. 9 illustrates a complementary version of the differential circuit shown in FIG. 8. The basic structure and operation of each of the level-shifting circuits 902*a*, 902*b* is identical to that of the level-shifting circuits 802*a*, 802*b* of FIG. 8, except for the presence and operation of additional level-shift capacitors $C_{LSAP}$, $C_{LSBP}$, switches 920*a*, 920*b*, and bias voltage nodes 923*a*, 923*b*. Like the circuit of FIG. 8, input nodes 916*a*, 916*b* in the circuit of FIG. 9 may, for example, be connected to respective outputs of a preceding amplifier stage. During each phase $\Phi_1$, the switches 910*a*, 910*b* are opened so that level-shift capacitors $C_{LSAN}$, $C_{LSBN}$, $C_{LSAP}$, $C_{LSBP}$ are disconnected from the positive and negative input nodes 916*a*, 916*b*, and the switches 912*a*, 912*b*, 914*a*, 914*b*, 920*a*, 920*b* are closed so that the plates of the level-shift capacitors $C_{LSAN}$ $C_{LSBN}$, $C_{LSAP}$, $C_{LSBP}$ are connected to reference voltage nodes 906*a*, 906*b* and bias voltage nodes 908*a*, 908*b*, 923*a*, 923*b*. The nodes 906*a*, 906*b*, 908*a*, 908*b*, 923*a*, 923*b* may, for example, be connected to outputs of one or more voltage sources that generate substantially constant voltages regardless of the loads attached thereto and the amount of charge transferred to or from the level-shift capacitors $C_{LSAN\ CLSBN}$, $C_{LSAP}$, $C_{LSBP}$. The nodes 906*a*, 906*b*, 908*a*, 908*b*, 923*a*, 923*b* may either be connected to separate voltage sources or to one or more shared voltage sources, depending on the layout and desired characteristics of the circuit. Connecting the level-shift capacitors $C_{LSAN}$ $C_{LSBN}$, $C_{LSAP}$, $C_{LSBP}$ across the nodes 906*a*, 906*b*, 908*a*, 908*b*, 923*a*, 923*b* thus sets the proper charges on the level-shift capacitors $C_{LSAN}$ $C_{LSBN}$, $C_{LSAP}$, $C_{LSBP}$ during the phase $\Phi_1$. During each phase $\Phi_2$, the switches 910*a*, 910*b* are closed and the switches 912*a*, 912*b*, 914*a*, 914*b*, 920*a*, 920*b* are opened, so that level-shift capacitors $C_{LSAN}$ $C_{LSBN}$, $C_{LSAP}$, $C_{LSBP}$ are connected back to the input nodes 916*a*, 916*b*, and act as batteries that force the correct bias voltages on the gates of NMOS transistors 918*a*, 918*b* and PMOS transistors 921*a*, 921*b* of the amplifier 904 for inputs that are equal to the reference voltages.

Accordingly, during each phase $\Phi_1$, the charge on each of the level-shift capacitors $C_{LSAN}$ $C_{LSBN}$, $C_{LSAP}$, $C_{LSBP}$ can be completely restored to the intended value, and, if an error is introduced onto any of the level-shift capacitors $C_{LSAN}$ $C_{LSBN}$, $C_{LSAP}$, $C_{LSBP}$ during a phase $\Phi_2$, it will be removed during the subsequent phase $\Phi_1$ and will not affect the following phase $\Phi_2$.

Figure 10:
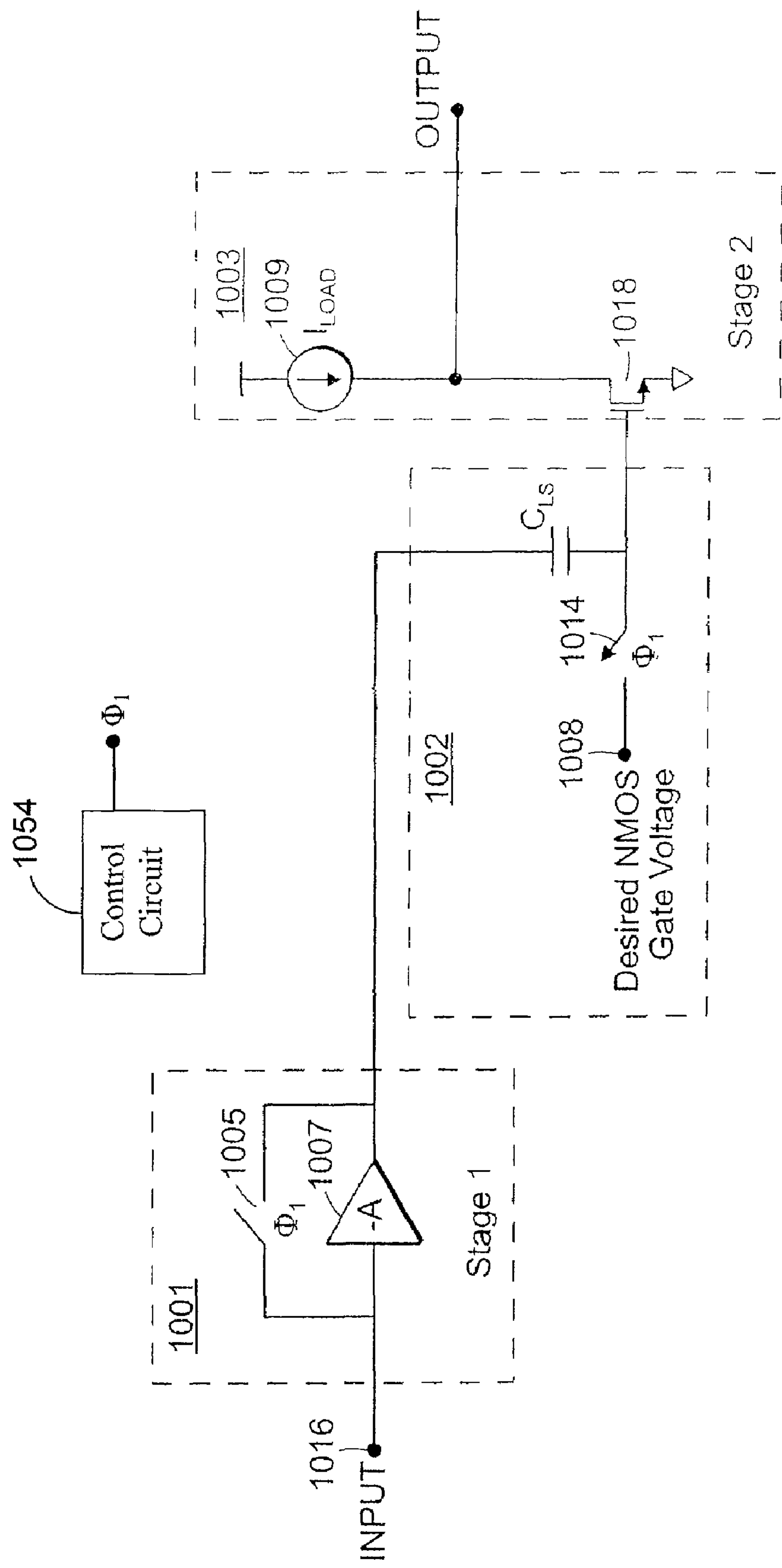
FIG. 10 is a diagram illustrating an example of an inventive switched-capacitor circuit and technique for biasing a level-shift capacitor disposed between two stages of a multiple-stage, single-ended amplifier circuit employing a class A common-source topology wherein a reference voltage for the level-shift capacitor is provided by the first amplifier stage during one operational phase.

FIG. 10 shows an inventive level-shift circuit that embodies additional or different aspects of the invention. As shown, the circuit of FIG. 10 comprises first and second circuit stages 1001, 1003, with a level shifting circuit 1002 disposed therebetween. In the illustrated embodiment, the level shifting circuit 1002 comprises a capacitor $C_{LS}$ and a switch 1014, with the capacitor being directly connected between an output of the first stage 1001 and the control electrode of an NMOS transistor 1018 included in the second stage 1003. As shown, the switch may be connected between a bias voltage node 1008 and the control electrode of NMOS transistor 1018.

In the example shown, the first stage 1001 comprises a single-ended amplifier 1007 and an associated switch 1005, and the second stage 1003 comprises a single-ended class A amplifier including an NMOS transistor 1018 and a current source load 1009. As shown, the switch 1005 may be connected between the input and the output of the amplifier 1007 and may be closed during each phase $\Phi_1$ so as to cause the amplifier 1007 to autozero during those phases. As such, the output of the first stage 1001 functions as a reference voltage during each phase $\Phi_1$. It should be appreciated that the first stage 1001 need not comprise an autozeroing amplifier, and may alternatively comprise any other preceding circuit stage that generates an output voltage equal to some "reference" value during each phase $\Phi_1$.

In the example shown, during each phase $\Phi_1$, the switches 1005, 1014 are closed so that the respective plates of the level-shift capacitor $C_{LS}$ are connected to the zeroed output of the amplifier stage 1001 and a bias voltage node 1008. The node 1008 may, for example, be connected to an output of a voltage source that generates a substantially constant voltage regardless of the load attached thereto and the amount of charge transferred to or from the level-shift capacitor $C_{LS}$. Connecting the level-shift capacitor $C_{LS}$ across these nodes thus sets the proper charge on the level-shift capacitor $C_{LS}$ during the phase $\Phi_1$. During each phase $\Phi_2$, the switches 1005, 1014 are opened, thus taking the amplifier 1007 out of its autozeroed state, but leaving the fully-charged level-shift capacitor $C_{LS}$ connected between the output of the amplifier 1007 and the control electrode of the NMOS transistor 1018. The level-shift capacitor $C_{LS}$ thus acts as a battery that forces the correct bias voltage on the gate of the NMOS transistor 1018 during each phase $\Phi_2$.

The circuit of FIG. 10 does not have the slow recovery problem discussed above in connection with FIG. 5, because during each phase $\Phi_1$, the charge on the level-shift capacitor $C_{LS}$ can be completely restored to the intended value. Therefore, if an error is introduced onto the level-shift capacitor $C_{LS}$ during a phase $\Phi_2$, it will be removed during the subsequent phase $\Phi_1$ and will not affect the following phase $\Phi_2$.

Figure 11:
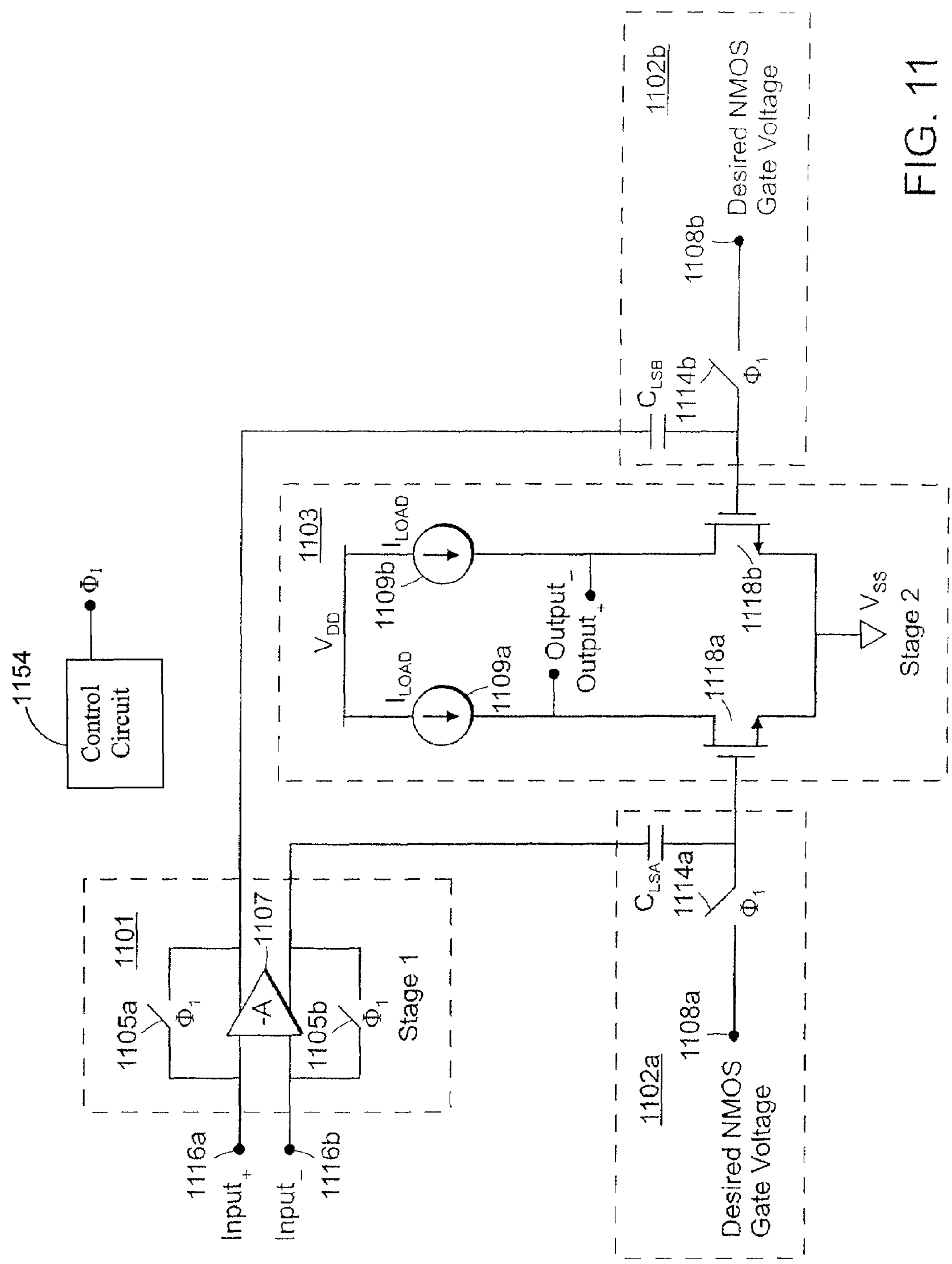
FIG. 11 is a diagram illustrating an example of an inventive switched-capacitor circuit and technique for biasing a pair of level-shift capacitor disposed between two stages of a differential multiple-stage amplifier circuit employing a class A common-source topology wherein reference voltages for the level-shift capacitors are provided by the first amplifier stage during one operational phase.

FIG. 11 shows a differential version of the circuit of FIG. 10. Like the circuit of FIG. 10, the circuit of FIG. 11 comprises first and second circuit stages 1101, 1103, with a level shifting circuit 1102 disposed therebetween. As shown, in the differential embodiment, one half 1102*a* of the level shifting circuit 1102 comprises a capacitor $C_{LSA}$ and a switch 1114*a*, and the other half 1102*b* of the level shifting circuit 1102 comprises a capacitor $C_{LSB}$ and a switch 1114*b*. The capacitors $C_{LSA}$, $C_{LSB}$ are directly connected between respective differential outputs of the first stage 1101 and the control electrodes of NMOS transistor 1118*a*, 1118*b* included in the second stage 1103. The switches are connected between bias voltage nodes 1108*a*, 1108*b* and the control electrodes of the NMOS transistors 1118*a*, 1118*b*.

As shown, the first stage 1101 may comprise a differential amplifier 1107 and associated switches 1105*a*, 1105*b*, and the second stage 1103 may comprise a differential class A amplifier including the NMOS transistors 1118*a*, 1118*b* and current source loads 1109*a*, 1109*b*. In the example shown, the switches 1105*a*, 1105*b* are connected between the respective differential inputs and outputs of the amplifier 1107 and are closed during each phase $\Phi_1$ so as to cause the amplifier 1107 to autozero during that phase. As such, the outputs of the first stage 1101 function as a reference voltage during each phase $\Phi_1$. It should be appreciated that the first stage 1101 need not comprise an autozeroing amplifier, and may alternatively comprise any other preceding circuit stage that generates an output voltage equal to some "reference" value during each phase $\Phi_1$.

In the example shown, during each phase $\Phi_1$, the switches 1105*a*, 1105*b*, 1114*a*, 1114*b* are closed so that the respective plates of level-shift capacitors $C_{LSA}$, $C_{LSB}$ are connected to the zeroed outputs of the amplifier 1107 and bias voltage nodes 1108*a*, 1108*b*. The nodes 1108*a*, 1108*b* may, for example, be connected to outputs of one or more voltage sources that generate substantially constant voltages regardless of the load attached thereto and the amount of charge transferred to or from the level-shift capacitor $C_{LSA}$, $C_{LSB}$. Connecting the level-shift capacitors $C_{LSA}$, $C_{LSB}$ across these nodes thus sets the proper charges on the level-shift capacitors $C_{LSA}$, $C_{LSB}$ during the phase $\Phi_1$. During each phase $\Phi_2$, the switches 1105*a*, 1105*b*, 1114*a*, 1114*b* are opened, thus taking the amplifier 1107 out of its autozeroed state, but leaving the fully-charged level-shift capacitors $C_{LSA}$, $C_{LSB}$ connected between the differential outputs of the amplifier 1107 and the control electrodes of the NMOS transistors 1118*a*, 1118*b*. The level-shift capacitors $C_{LSA}$, $C_{LSB}$ thus act as batteries that force the correct bias voltages on the gates of the NMOS transistors 1118*a*, 1118*b* during each phase $\Phi_2$.

Thus, during each phase $\Phi_1$, the charges on the level-shift capacitors $C_{LSA}$, $C_{LSB}$ can be completely restored to the intended values. Therefore, if any errors are introduced onto the level-shift capacitors $C_{LSA}$, $C_{LSB}$ during a phase $\Phi_2$, they will be removed during the subsequent phase $\Phi_1$ and will not affect the following phase $\Phi_2$.

Figure 12:
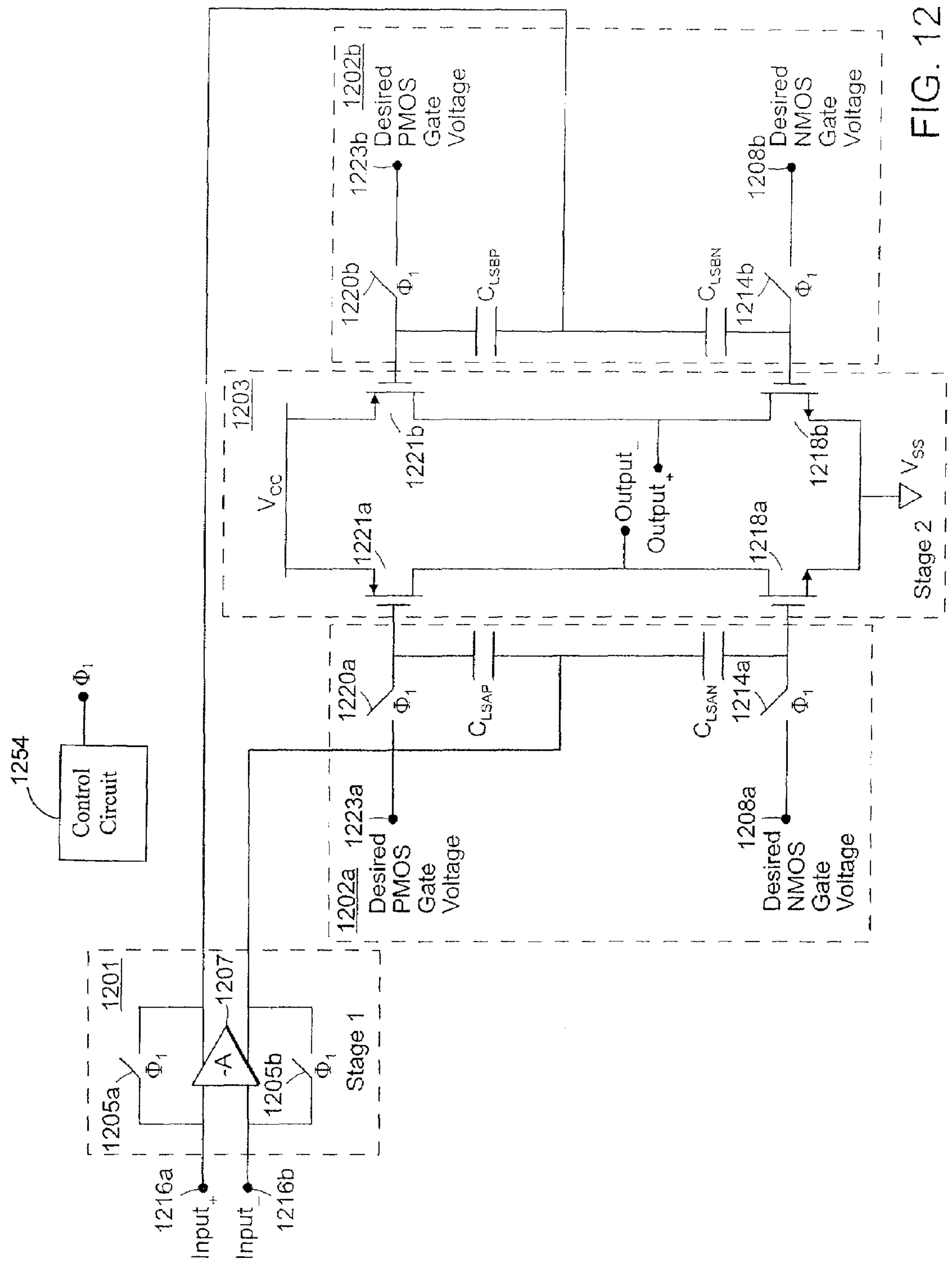
FIG. 12 is a diagram illustrating an example of an inventive switched-capacitor circuit and technique for biasing four separate level-shift capacitors disposed between two stages of a differential multiple-stage amplifier circuit employing a class AB common-source topology wherein a reference voltage for the level-shift capacitor is provided by the first amplifier stage during one operational phase.

FIG. 12 shows a complementary version of the differential circuit of FIG. 11. Like the circuits of FIGS. 10 and 11, the circuit of FIG. 12 comprises first and second circuit stages 1101, 1103, with a level shifting circuit 1102 disposed therebetween. As shown, in the embodiment of FIG. 12, one half 1202*a* of the level shifting circuit 1202 comprises a pair of capacitors $C_{LSAN}$, $C_{LSAP}$ and a corresponding pair of switches 1214*a*, 1220*a*, and the other half 1202*b* of the level shifting circuit 1202 comprises a pair of capacitors $C_{LSBN}$, $C_{LSBP}$ and a corresponding pair of switches 1214*b*, 1220*b*. As shown, in this embodiment, the capacitors $C_{LSAN}$, $C_{LSBN}$, $C_{LSAP}$, $C_{LSBP}$ are directly connected between differential outputs of the first stage 1201 and the control electrodes of respective ones of NMOS transistor 1218*a*, 1218*b* and PMOS transistors 1221*a*, 1221*b* included in the second stage 1203. The switches 1214*a*, 1214*b*, 1220*a*, 1220*b* are connected between bias voltage nodes 1208*a*, 1208*b*, 1223*a*, 1223*b* and the control electrodes of the NMOS transistors 1218*a*, 1218*b*, and PMOS transistors 1221*a*, 1221*b*.

As shown, the first stage 1201 may comprise a differential amplifier 1207 and associated switches 1205*a*, 1205*b*, and the second stage may comprise a differential class AB amplifier including the NMOS transistors 1218*a*, 1218*b* and the PMOS transistors 1221*a*, 1221*b*. In the example shown, the switches 1205*a*, 1205*b* are connected between the respective differential inputs and outputs of the amplifier 1207 and are closed during each phase $\Phi_1$ so as to cause the amplifier 1207 to autozero during that phase. As such, the outputs of the first stage 1201 function as a reference voltage during each phase $\Phi_1$. It should be appreciated that the first stage 1201 need not comprise an autozeroing amplifier, and may alternatively comprise any other preceding circuit stage that generates an output voltage equal to some "reference" value during each phase $\Phi_1$.

In the example shown, during each phase $\Phi_1$, the switches 1205*a*, 1205*b*, 1214*a*, 1214*b*, 1220*a*, 1220*b* are closed so that the respective plates of level-shift capacitors $C_{LSAN}$, $C_{LSBN}$, $C_{LSAP}$, $C_{LSBP}$ are connected to the zeroed outputs of the amplifier 1207 and bias voltage nodes 1208*a*, 1208*b*, 1223*a*, 1223*b*. The nodes 1208*a*, 1208*b*, 1223*a*, 1223*b* may, for example, be connected to outputs of one or more voltage sources that generate substantially constant voltages regardless of the load attached thereto and the amount of charge transferred to or from the level-shift capacitors $C_{LSAN}$, $C_{LSBN}$, $C_{LSAP}$, $C_{LSBP}$. Connecting the level-shift capacitors $C_{LSAN}$, $C_{LSBN}$, $C_{LSAP}$, $C_{LSBP}$ across these nodes thus sets the proper charges on the level-shift capacitors $C_{LSAN}$, $C_{LSBN}$, $C_{LSAP}$, $C_{LSBP}$ during the phase $\Phi_1$. During each phase $\Phi_2$, the switches 1205*a*, 1205*b*, 1214*a*, 1214*b*, 1220*a*, 1220*b* are opened, thus taking the amplifier 1207 out of its autozeroed state, but leaving the fully-charged level-shift capacitors $C_{LSAN}$, $C_{LSBN}$, $C_{LSAP}$, $C_{LSBP}$ connected between the differential outputs of the amplifier 1207 and the control electrodes of the NMOS transistors 1218*a*, 1218*b* and the PMOS transistors 1221*a*, 1221*b*. The level-shift capacitors $C_{LSAN}$, $C_{LSBN}$, $C_{LSAP}$, $C_{LSBP}$ thus act as batteries that force the correct bias voltages on the gates of the NMOS transistors 1218*a*, 1218*b* and the PMOS transistors 1221*a*, 1221*b* during each phase $\Phi_2$.

Thus, during each phase $\Phi_1$, the charges on the level-shift capacitors $C_{LSAN}$, $C_{LSBN}$, $C_{LSAP}$, $C_{LSBP}$ can be completely restored to the intended values. Therefore, if any errors are introduced onto the level-shift capacitors $C_{LSAN}$, $C_{LSBN}$, $C_{LSAP}$, $C_{LSBP}$ during a phase $\Phi_2$, they will be removed during the subsequent phase $\Phi_1$ and will not affect the following phase $\Phi_2$.

Figure 13:
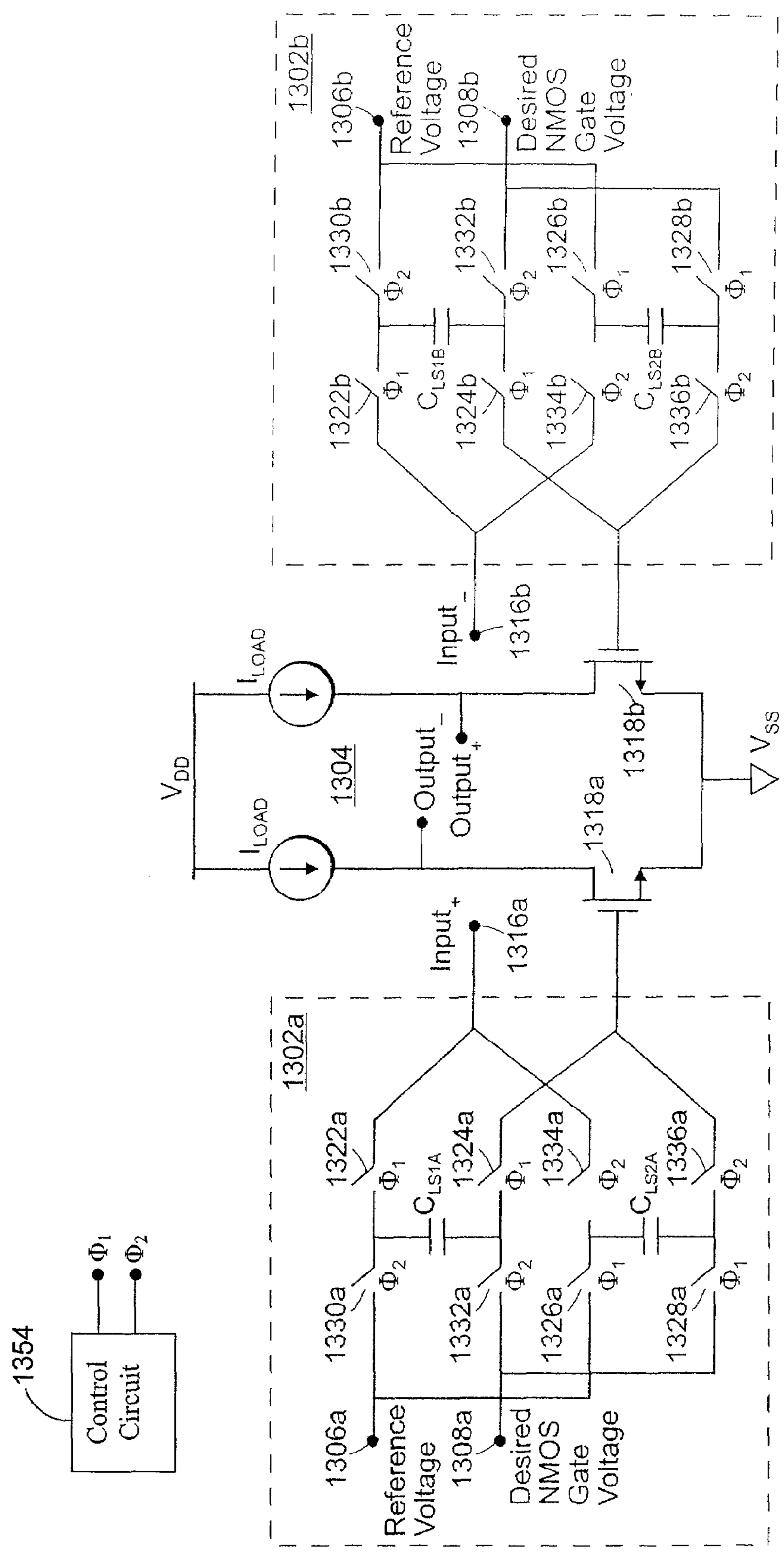
FIG. 13 is a diagram illustrating an example of an inventive switched-capacitor circuit and technique that involves the swapping of level-shift capacitors in a differential amplifier circuit employing a class A common-source topology.

Another example of an inventive level-shifting circuit for use in level shifting the input of an amplifier or otherwise is shown in FIG. 13. In the example shown, level-shifting circuit 1302 comprises two halves 1302*a*, 1302*b* that are configured and arranged to level shift the input voltages of a differential class A common-source amplifier 1304. Like the other circuits discussed above, input nodes 1316*a*, 1316*b* in the circuit of FIG. 13 may, for example, be connected to respective outputs of a preceding amplifier stage. As shown, the half 1302*a* of the level-shifting circuit 1302 comprises two level-shift capacitors $C_{LS1A}$ and $C_{LS2A}$, and eight switches 1322*a*, 1324*a*, 1326*a*, 1328*a*, 1330*a*, 1332*a*, 1334*a*, 1336*a*, and the half 1302*b* of the level-shifting circuit 1302 comprises two level-shift capacitors $C_{LS1B}$ and $C_{LS2B}$, and eight switches 1322*b*, 1324*b*, 1326*b*, 1228*b*, 1330*b*, 1332*b*, 1334*b*, 1336*b*.

During each phase $\Phi_1$, eight of the switches 1322*a*, 1324*a*, 1326*a*, 1328*a*, 1322*b*, 1324*b*, 1326*b*, 1328*b* are closed, and the other eight switches 1330*a*, 1332*a*, 1334*a*, 1336*a*, 1330*b*, 1332*b*, 1334*b*, 1336*b* are opened, thus causing two of the level-shift capacitors $C_{LS2A}$, $C_{LS2B}$ to be connected between reference voltage nodes 1306*a*, 1306*b* and bias voltage nodes 1308*a*, 1308*b* and to be disconnected from the input nodes 1316*a*, 1316*b* and the gates of the transistors 1318*a*, 1318*b* of the amplifier 1304, while the other two level-shift capacitors $C_{LS1A}$, $C_{LS1B}$ are connected between the input nodes 1316*a*, 1316*b* and the gates of the transistors 1318*a*, 1318*b* of the amplifier 1304 and are disconnected from the reference voltage nodes 1306*a*, 1306*b* and the bias voltage nodes 1308*a*, 1308*b*.

During each phase $\Phi_2$, the eight switches 1330*a*, 1332*a*, 1334*a*, 1336*a*, 1330*b*, 1332*b*, 1334*b*, 1336*b* are closed, and the eight switches 1322*a*, 1324*a*, 1326*a*, 1328*a*, 1322*b*, 1324*b*, 1326*b*, 1328*b* are opened, thus causing the level-shift capacitors $C_{LS1A}$, $C_{LS1B}$ to be connected between the reference voltage nodes 1306*a*, 1306*b* and the bias voltage nodes 1308*a*, 1308*b* and to be disconnected from the input nodes 1316*a*, 1316*b* and the gates of the transistors 1318*a*, 1318*b* of the amplifier 1304, while the level-shift capacitors $C_{LS2A}$, $C_{LS2B}$ are connected between the input nodes 1316*a*, 1316*b* and the gates of the transistors 1318*a*, 1318*b* of the amplifier 1304 and are disconnected from the reference voltage nodes 1306*a*, 1306*b* and the bias voltage nodes 1308*a*, 1308*b*.

The nodes 1306*a*, 1306*b*, 1308*a*, 1308*b* may, for example, be connected to outputs of one or more voltage sources that generate substantially constant voltages regardless of the load attached thereto and the amount of charge transferred to or from the level-shift capacitors $C_{LS1A}$, $C_{LS2A}$, $C_{LS1B}$, $C_{LS2B}$. Connecting the level-shift capacitors $C_{LS1A}$, $C_{LS2A}$, $C_{LS1B}$, $C_{LS2B}$ across the nodes 1306*a*, 1306*b*, 1308*a*, 1308*b* thus sets the proper charge on the level-shift capacitors $C_{LS1A}$, $C_{LS2A}$, $C_{LS1B}$, $C_{LS2B}$ during respective phases $\Phi_1$, $\Phi_2$. The nodes 1306*a*, 1306*b*, 1308*a*, 1308*b* may either be connected to separate voltage sources or to a shared voltage source, depending on the layout and desired characteristics of the circuit.

The capacitors $C_{LS1A}$ and $C_{LS2A}$, as well as the capacitors $C_{LS1B}$ and $C_{LS2B}$, are thus swapped with one another at the beginning of each of the phases $\Phi_1$ and $\Phi_2$, with two of them being charged and the other two actively introducing voltage level shifts to the amplifier input nodes during each phase. As such, any error charges introduced during one phase will be removed from the capacitors during the next phase. Also, in this configuration there are always capacitors connected between the input nodes 1316*a*, 1316*b* and the gates of the transistors 1318*a*, 1318*b* of the amplifier 1304, thus allowing the level-shift to operate during both phases.

Figure 14:
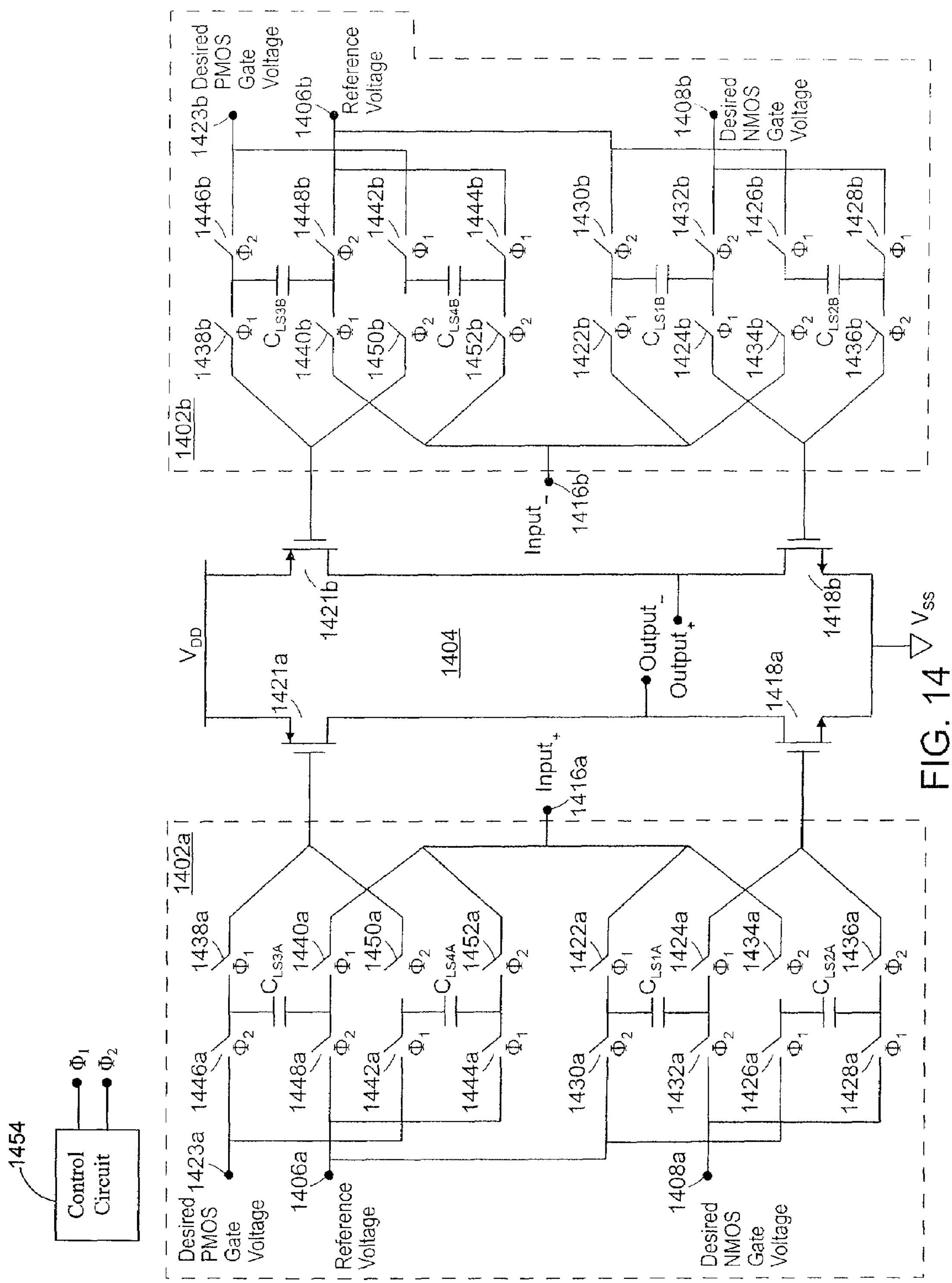
FIG. 14 is a diagram illustrating an example of an inventive switched-capacitor circuit and technique that involves the swapping of level-shift capacitors in a differential amplifier circuit employing a class AB common-source topology.

FIG. 14 shows a complementary version of the circuit of FIG. 13. In the example shown, level-shifting circuit 1402 comprises two halves 1402*a*, 1402*b* that are configured and arranged to level shift the input voltages of a differential class AB common-source amplifier 1404. Like the other circuits discussed above, input nodes 1416*a*, 1416*b* in the circuit of FIG. 14 may, for example, be connected to respective outputs of a preceding amplifier stage. As shown, the half 1402*a* of the level-shifting circuit 1402 comprises four level-shift capacitors $C_{LS1A}$, $C_{LS2A}$, $C_{LS3A}$, $C_{LS4A}$ and sixteen switches 1422*a*, 1424*a*, 1426*a*, 1428*a*, 1430*a*, 1432*a*, 1434*a*, 1436*a*, 1438*a*, 1440*a*, 1442*a*, 1444*a*, 1446*a*, 1448*a*, 1450*a*, 1452*a*, and the half 1402*b* of the level-shifting circuit 1402 comprises four level-shift capacitors $C_{LS1B}$, $C_{LS2B}$, $C_{LS3B}$, $C_{LS4B}$ and sixteen switches 1422*b*, 1424*b*, 1426*b*, 1428*b*, 1430*b*, 1432*b*, 1434*b*, 1436*b*, 1438*b*, 1440*b*, 1442*b*, 1444*b*, 1446*b*, 1448*b*, 1450*b*, 1452*b*.

During each phase $\Phi_1$, sixteen of the switches 1422*a*, 1424*a*, 1426*a*, 1428*a*, 1422*b*, 1424*b*, 1426*b*, 1428*b*, 1438*a*, 1440*a*, 1442*a*, 1444*a*, 1438*b*, 1440*b*, 1442*b*, 1444*b* are closed, and the other sixteen switches 1430*a*, 1432*a*, 1434*a*, 1436*a*, 1430*b*, 1432*b*, 1434*b*, 1436*b*, 1446*a*, 1448*a*, 1450*a*, 1452*a*, 1446*b*, 1448*b*, 1450*b*, 1452*b* are opened, thus causing four of the level-shift capacitors $C_{LS2A}$, $C_{LS2B}$, $C_{LS4A}$, $C_{LS4B}$ to be connected between reference voltage nodes 1406*a*, 1406*b* and bias voltage nodes 1408*a*, 1408*b*, 1423*a*, 1423*b* and to be disconnected from the input nodes 1416*a*, 1416*b* and the gates of the transistors 1418*a*, 1418*b*, 1421*a*, 1421*b* of the amplifier 1404, while the other four level-shift capacitors $C_{LS1A}$, $C_{LS1B}$, $C_{LS3A}$, $C_{LS3B}$ are connected between the input nodes 1416a, 1416b and the gates of the transistors 1418a, 1418b, 1421a, 1421b of the amplifier 1404 and are disconnected from the reference voltage nodes 1406a, 1406b and the bias voltage nodes 1408a, 1408b, 1423a, 1423b.

During each phase $\Phi_2$, the sixteen switches 1430a, 1432a, 1434a, 1436a, 1430b, 1432b, 1434b, 1436b, 1446a, 1448a, 1450a, 1452a, 1446b, 1448b, 1450b, 1452b are closed, and the sixteen switches 1422a, 1424a, 1426a, 1428a, 1422b, 1424b, 1426b, 1428b, 1438a, 1440a, 1442a, 1444a, 1438b, 1440b, 1442b, 1444b are opened, thus causing the level-shift capacitors $C_{LS1A}$, $C_{LS1B}$, $C_{LS3A}$, $C_{LS3B}$ to be connected between the reference voltage nodes 1406a, 1406b and the bias voltage nodes 1408a, 1408b, 1423a, 1423b and to be disconnected from the input nodes 1416a, 1416b and the gates of the transistors 1418a, 1418b, 1421a, 1421b of the amplifier 1404, while the level-shift capacitors $C_{LS2A}$, $C_{LS2B}$, $C_{LS4A}$, $C_{LS4B}$ are connected between the input nodes 1416a, 1416b and the gates of the transistors 1418a, 1418b, 1421a, 1421b of the amplifier 1404 and are disconnected from the reference voltage nodes 1406a, 1406b and the bias voltage nodes 1408a, 1408b, 1423a, 1423b.

The nodes 1406a, 1406b, 1408a, 1408b, 1423a, 1423b may, for example, be connected to outputs of one or more voltage sources that generate substantially constant voltages regardless of the load attached thereto and the amount of charge transferred to or from the level-shift capacitors $C_{LS1A}$, $C_{LS1B}$, $C_{LS2A}$, $C_{LS2B}$, $C_{LS3A}$, $C_{LS3B}$, $C_{LS4A}$, $C_{LS4B}$. Connecting the level-shift capacitors $C_{LS1A}$, $C_{LS1B}$, $C_{LS2A}$, $C_{LS2B}$, $C_{LS3A}$, $C_{LS3B}$, $C_{LS4A}$, $C_{LS4B}$ across the nodes 1406a, 1406b, 1408a, 1408b, 1423a, 1423b thus sets the proper charge on the level-shift capacitors $C_{LS1A}$, $C_{LS1B}$, $C_{LS2A}$, $C_{LS2B}$, $C_{LS3A}$, $C_{LS3B}$, $C_{LS4A}$, $C_{LS4B}$ during respective phases $\Phi_1$, $\Phi_2$. The nodes 1406a, 1406b, 1408a, 1408b, 1423a, 1423b may either be connected to separate voltage sources or to one or more shared voltage source, depending on the layout and desired characteristics of the circuit.

The two capacitors included in each pair of capacitors $C_{LS1A}$ and $C_{LS2A}$, $C_{LS1B}$ and $C_{LS2B}$, $C_{LS1C}$ and $C_{LS2C}$, $C_{LS1D}$ and $C_{LS2D}$, are thus swapped with one another at the beginning of each of the phases $\Phi_1$ and $\Phi_2$, such that one group of four capacitors is being charged and another group of four capacitors is actively introducing voltage level shifts to the amplifier input nodes during each phase. As such, any error charges introduced during one phase will be removed from the capacitors during the next phase. Also, in this configuration there are always capacitors connected between the input nodes 1416a, 1416b and the gates of the transistors 1418a, 1418b, 1421a, 1421b of the amplifier 1404, thus allowing the level-shift to operate during both phases.

Figure 15:
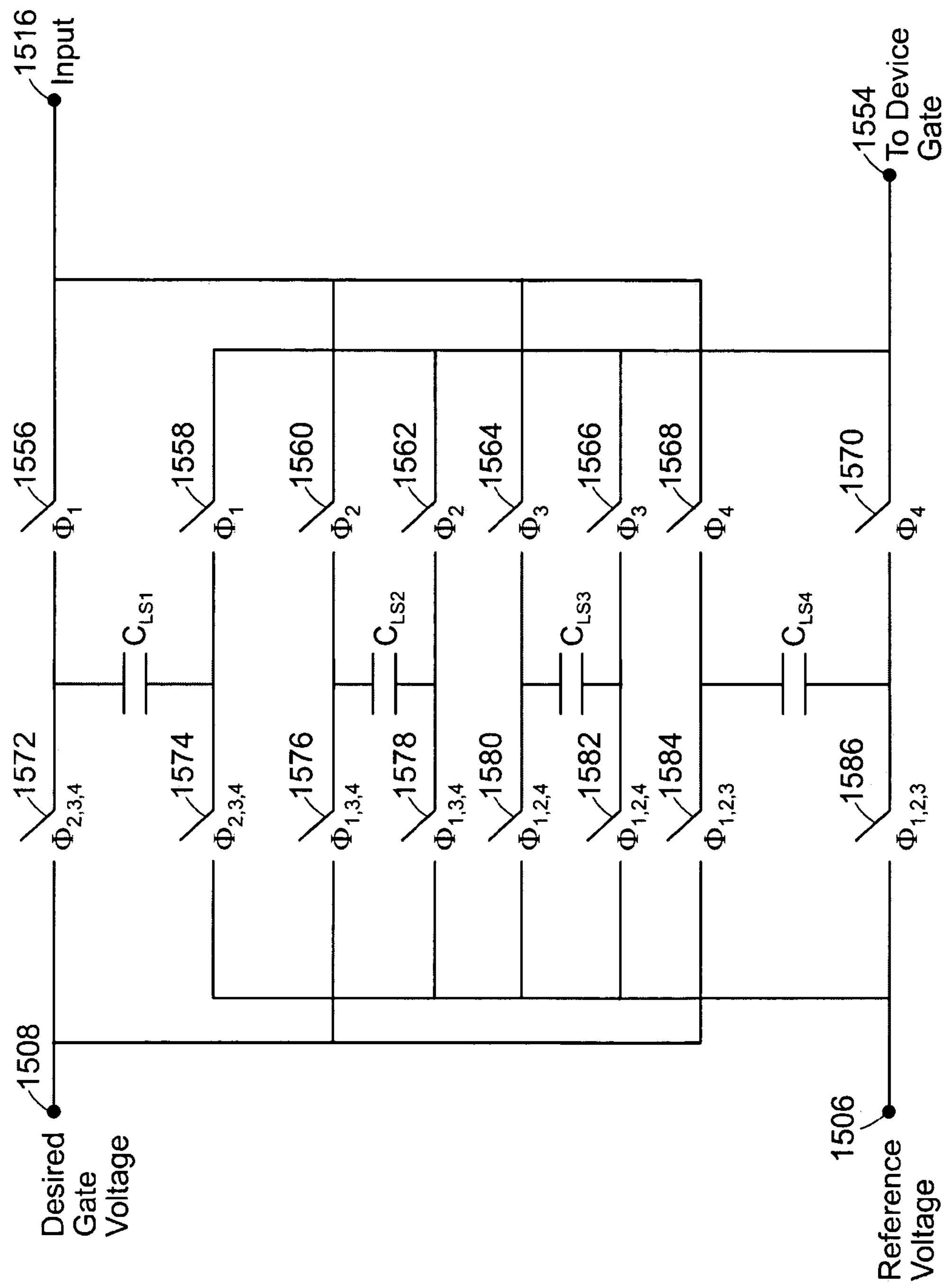
FIG. 15 is a diagram illustrating an example of alternative circuit that may be employed in either of the embodiments of FIGS. 13 and 14, in which four, rather than two, level-shift capacitors are employed to level shift respective input nodes of an amplifier or other circuit.

In alternative embodiments of the circuits shown in FIGS. 13 and 14, one or more additional capacitors and associated switches can be employed in the level-shifting circuit corresponding to each amplifier input node. An illustrative example of such a level-shifting circuit, which employs four, rather than two, level-shift capacitors $C_{LS1}$, $C_{LS2}$, $C_{LS3}$, $C_{LS4}$, to accomplish the level-shifting for an input node 1554 of a succeeding circuit, e.g., a gate of an input transistor of an amplifier, is shown in FIG. 15. In operation, switches 1556-1588 may be controlled so that each of the level-shift capacitors $C_{LS1}$, $C_{LS2}$, $C_{LS3}$, $C_{LS4}$ is connected between the input node 1516 and the input node of the succeeding circuit 1554 during a respective one of four phases $\Phi_1$, $\Phi_2$, $\Phi_3$, $\Phi_4$, and is connected between a reference voltage node 1506 and a bias voltage node 1508 during one or more (and preferably all) of the phases $\Phi_1$, $\Phi_2$, $\Phi_3$, $\Phi_4$ during which it is not connected between the input node 1516 and the input of the succeeding circuit 1554.

Figure 16:
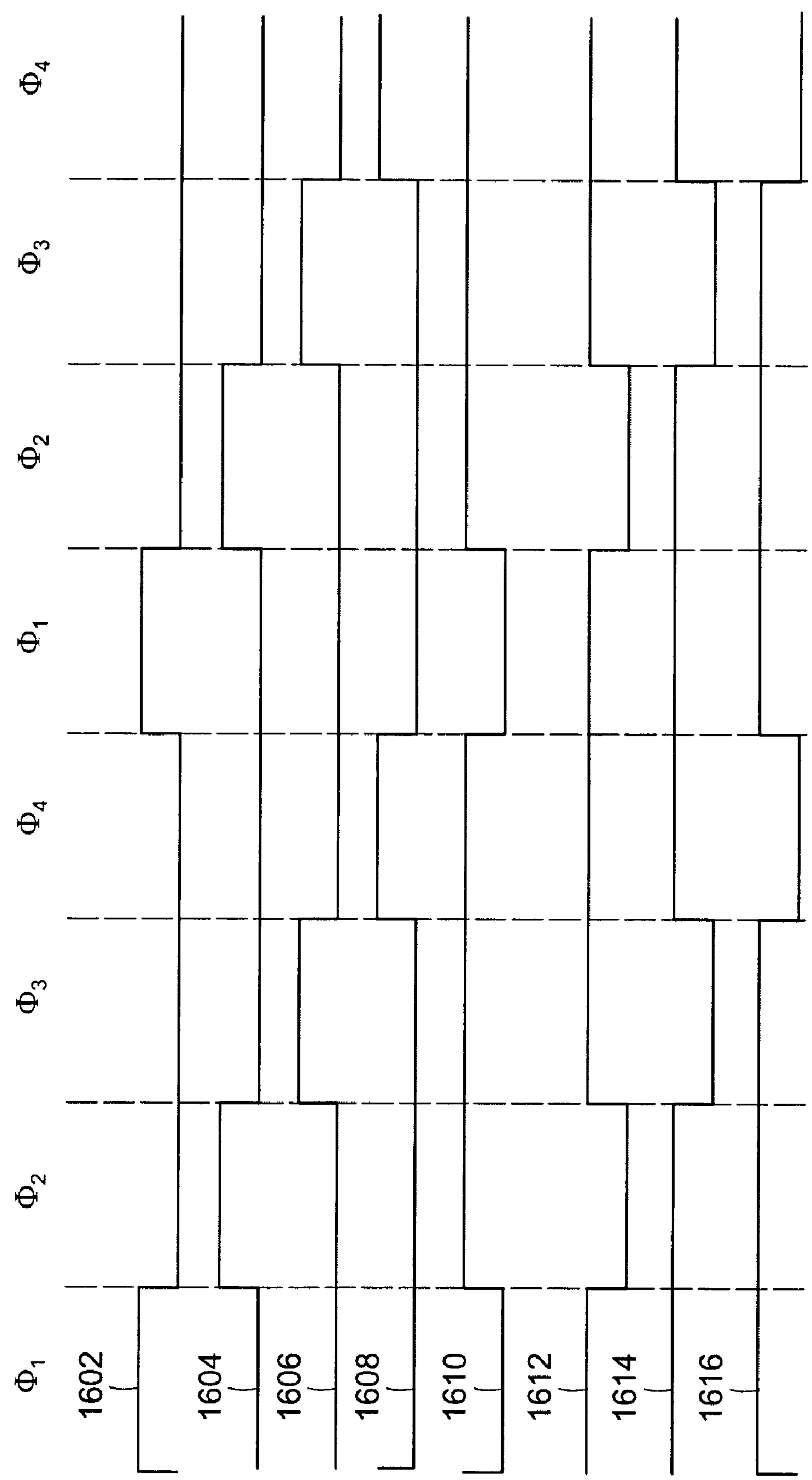
FIG. 16 is a timing diagram illustrating examples of signals that may be used to control various switches in the circuit of FIG. 15.

FIG. 16 illustrates clock signals that may be generated to control the switches in an embodiment such as that shown in FIG. 15 wherein all of the switches are configured to be closed in response to a logical high state. It should be appreciated, however, that any of numerous clocking schemes and switch types could be employed to perform such a function, and the invention is not limited in this respect. As shown, the clock signal 1602 may be used to control the switches 1556, 1558, the clock signal 1604 may be used to control the switches 1560, 1562, the clock signal 1606 may be used to control the switches 1564, 1566, the clock signal 1608 may be used to control the switches 1568, 1570, the clock signal 1610 may be used to control the switches 1572, 1574, the clock signal 1612 may be used to control the switches 1576, 1578, the clock signal 1614 may be used to control the switches 1580, 1582, and the clock signal 1616 may be used to control the switches 1584, 1586.

Though shown with particular amplifier topologies, any of the level-shifting circuits disclosed herein can be used as the level-shift in various other amplifier topologies, or in any other application in which a level shift may be desirable or required. For instance, although not explicitly shown, it should be appreciated that, in some embodiments, one-half of any of the differential circuits of FIGS. 9, 12, and 14, i.e., a level-shifted single-ended class AB topology, may alternatively be employed. Also, although most of the examples presented herein are of common-source topologies, the invention is not limited in that respect, as common-drain topologies can likewise be employed. Moreover, although the examples presented herein employ metal oxide semiconductor field effect transistors (MOSFET), the disclosed level-shifting circuits and techniques may likewise be employed in layouts employing bipolar junction transistors (BJTs) or any other type of transistors or other devices.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method, comprising steps of:

(a) providing a circuit comprising at least first and second circuit stages and a first level-shift capacitor, each of the first and second circuit stages comprising at least one input, at least one output, and at least one signal processing element coupled therebetween;

(b) receiving at least one signal that defines at least first and second phases;

(c) providing a first circuit node having a first approximately constant voltage thereon at least during the first and second phases, wherein the first approximately constant voltage remains approximately constant when a significant amount of charge is transferred between the first circuit node and the first level shift capacitor during a first phase;

(d) providing a second circuit node having a first reference voltage thereon at least during the first phases;

(e) during each first phase, configuring the circuit such that respective plates of the first level-shift capacitor are connected to the first and second circuit nodes, thereby allowing the first level-shift capacitor to charge to a level-shift voltage equal to a difference between the first approximately constant voltage and the first reference voltage; and (f) during each second phase, configuring the circuit such that the respective plates of the first level-shift capacitor are connected to a first output of the first circuit stage and a first input of the second circuit stage, without causing the first level-shift capacitor to be connected in parallel with another capacitor with which it was not connected in parallel during a preceding first phase, thereby introducing the voltage across the first level-shift capacitor as an offset voltage between the first and second circuit stages.

2. The method of claim 1, wherein the first and second circuit stages comprise first and second amplifier stages of an amplifier circuit.

3. The method of claim 1, further comprising steps of:

(g) providing a second level shift capacitor;

(h) providing a third circuit node having a second approximately constant voltage thereon at least during the first and second phases, wherein the second approximately constant voltage remains approximately constant when a significant amount of charge is transferred between the third circuit node and the second level shift capacitor during a first phase;

(i) providing a fourth circuit node having a second reference voltage thereon at least during the first phases;

(j) during each first phase, configuring the circuit such that respective plates of the second level-shift capacitor are connected to the third and fourth circuit nodes, thereby allowing the second level-shift capacitor to charge to a level-shift voltage equal to a difference between the second approximately constant voltage and the second reference voltage; and (k) during each second phase, configuring the circuit such that the respective plates of the second level-shift capacitor are connected to a second output of the first circuit stage and a second input of the second circuit stage, without causing the second level-shift capacitor to be connected in parallel with another capacitor with which it was not connected in parallel during a preceding first phase, thereby introducing the voltage across the second level-shift capacitor as an offset voltage between the first and second circuit stages.

4. The method of claim 3, wherein the first and second circuit stages comprise first and second amplifier stages of an amplifier circuit, and wherein the first and second inputs of the second amplifier stage comprise respective inputs of a differential amplifier stage.

5. The method of claim 2, wherein:

the step (e) comprises configuring the circuit such that neither plate of the first level- shift capacitor is connected to the first output of the first amplifier stage during each first phase.

6. The method of claim 2, wherein the second circuit node corresponds to the first output of the first amplifier stage, and the method further comprises steps of:

(g) causing the first amplifier stage to produce an approximately constant reference voltage at the first output thereof during each first phase; and (h) allowing the first amplifier stage to produce a variable voltage at the first output thereof during each second phase.

7. The method of claim 6, wherein:

the step (g) comprises controlling at least one switch so as to cause an input of the first amplifier stage to be connected to the first output of the first amplifier stage during each first phase; and the step (h) comprises controlling the at least one switch so as to cause the input of the first amplifier stage to be disconnected from the first output of the first amplifier stage during each second phase.

8. The method of claim 1, further comprising steps of:

(g) providing a second level shift capacitor;

(h) during each first phase, configuring the circuit such that respective plates of the second level-shift capacitor are connected to the first output of the first circuit stage and the first input of the second circuit stage, without causing the second level-shift capacitor to be connected in parallel with another capacitor with which it was not connected in parallel during a preceding second phase, thereby introducing the voltage across the second level-shift capacitor as an offset voltage between the first and second circuit stages; and (i) during each second phase, configuring the circuit such that the respective plates of the second level-shift capacitor are connected to the first and second circuit nodes, thereby allowing the second level-shift capacitor to charge to a level-shift voltage equal to a difference between the first approximately constant voltage and the first reference voltage.

9. A method, comprising steps of:

(a) providing a circuit comprising at least first and second circuit stages and a first level-shift capacitor, wherein each of the first and second circuit stages comprises at least one input, at least one output, and at least one signal processing element coupled therebetween, and wherein the at least one output of the second circuit stage is connected to a load;

(b) receiving at least one signal that defines at least first and second phases;

(c) providing a first circuit node having a first approximately constant voltage thereon at least during the first phases, wherein the first approximately constant voltage remains approximately constant when a significant amount of charge is transferred between the first circuit node and the first level-shift capacitor during a first phase, and wherein the at least one output of the second circuit stage remains connected to the load when the first approximately constant voltage is established on the first node during the first phases;

(d) providing a second circuit node having a first reference voltage thereon at least during the first phases;

(e) during each first phase, configuring the circuit such that respective plates of the first level-shift capacitor are connected to the first and second circuit nodes, thereby allowing the first level-shift capacitor to charge to a level-shift voltage equal to a voltage difference between the first approximately constant voltage and the first reference voltage; and (f) during each second phase, configuring the circuit such that the respective plates of the first level-shift capacitor are connected to a first output of the first circuit stage and a first input of the second circuit stage, without causing the first level-shift capacitor to be connected in parallel with another capacitor with which it was not connected in parallel during a preceding first phase, thereby introducing the voltage across the first level-shift capacitor as an offset voltage between the first and second circuit stages.

10. The method of claim 9, wherein the first and second circuit stages comprise first and second amplifier stages of an amplifier circuit.

11. The method of claim 9, further comprising steps of:

(g) providing a second level shift capacitor;

(h) providing a third circuit node having a second approximately constant voltage thereon at least during the first phases, wherein the second approximately constant voltage remains approximately constant when a significant amount of charge is transferred between the third circuit node and the second level-shift capacitor during a first phase, and wherein the at least one output of the second circuit stage remains connected to the load when the first approximately constant voltage is established on the third node during the first phases;

(i) providing a fourth circuit node having a second reference voltage thereon at least during the first phases;

(j) during each first phase, configuring the circuit such that respective plates of the second level-shift capacitor are connected to the third and fourth circuit nodes, thereby allowing the second level-shift capacitor to charge to a level-shift voltage equal to a difference between the second approximately constant voltage and the second reference voltage; and (k) during each second phase, configuring the circuit such that the respective plates of the second level-shift capacitor are connected to a second output of the first circuit stage and a second input of the second circuit stage, without causing the second level-shift capacitor to be connected in parallel with another capacitor with which it was not connected in parallel during a preceding first phase, thereby introducing the voltage across the second level-shift capacitor as an offset voltage between the first and second circuit stages.

12. The method of claim 11, wherein the first and second circuit stages comprise first and second amplifier stages of an amplifier circuit, and wherein the first and second inputs of the second amplifier stage comprise respective inputs of a differential amplifier stage.

13. The method of claim 9, further comprising steps of:

(g) providing a second level shift capacitor;

(h) during each first phase, configuring the circuit such that the respective plates of the second level-shift capacitor are connected to the first output of the first circuit stage and the first input of the second circuit stage, without causing the second level-shift capacitor to be connected in parallel with another capacitor with which it was not connected in parallel during a preceding first phase, thereby introducing the voltage across the second level-shift capacitor as an offset voltage between the first and second circuit stages; and (i) during each second phase, configuring the circuit such that the respective plates of the second level-shift capacitor are connected to the first and second circuit nodes, thereby allowing the second level-shift capacitor to charge to a level-shift voltage equal to a difference between the first approximately constant voltage and the first reference voltage.

14. A circuit, comprising:

a first circuit stage comprising at least one first input, at least one first output, and at least one first signal processing element coupled therebetween, the first circuit stage being configured and arranged to produce a reference voltage at the at least one first output during each first phase of at least first and second phases, and to produce an output signal at the at least one first output that is responsive to an input signal at the at least one first input during each second phase of the at least first and second phases;

a second circuit stage comprising at least one second input, at least one second output, and at least one second signal processing element coupled therebetween;

at least one level shifting circuit, comprising at least one capacitor and at least one switch, coupled between the first circuit stage and the second circuit stage; and a control circuit configured to control the level shifting circuit such that, during each first phase, respective plates of the at least one capacitor are connected to the at least one first output of the first circuit stage and a source of an approximately constant voltage so as to allow the at least one capacitor to be charged to a level-shift voltage equal to a difference between the approximately constant voltage and the reference voltage, and such that, during each second phase, the respective plates of the at least one capacitor are connected to the at least one first output and the at least one second input to thereby introduce the level-shift voltage across the at least one capacitor as an offset voltage therebetween.

15. The circuit of claim 14, wherein the source of the approximately constant voltage is configured and arranged such that the approximately constant voltage remains approximately constant when a significant amount of charge is transferred between the source of the approximately constant voltage and the at least one capacitor during a first phase.

16. The circuit of claim 14, wherein:

the first and second circuit stages comprise respective amplifier stages of a multi-stage amplifier;

the first circuit stage further comprises at least one autozeroing switch connected between an input and an output of the first stage; and the first circuit stage is configured and arranged such that the at least one autozeroing switch is closed during each first phase and opened during each second phase.

17. A method, comprising steps of:

(a) providing a circuit comprising first and second circuit stages, and first, second, third, and fourth level-shifting capacitors, wherein each of the first and second circuit stages comprises at least one input, at least one output, and at least one signal processing element coupled therebetween, and wherein the second circuit stage comprises first and second differential inputs;

(b) receiving at least one signal that defines at least first and second phases;

(c) providing first and second circuit nodes having approximately constant voltages thereon at least during the first phases, and third and fourth circuit nodes having reference voltages thereon at least during the first phases;

(d) during each first phase, configuring the circuit such that (1) respective plates of the first level-shift capacitor are connected to the first and third circuit nodes, (2) respective plates of the second level-shift capacitor are connected to the second and fourth voltage nodes, (3) respective plates of the third level-shift capacitor are connected to an output of the first circuit stage and the first differential input of the second circuit stage, and (4) respective plates of the fourth level-shift capacitors are connected to an output of the first circuit stage and the second differential input of the second circuit stage; and (e) during each second phase, configuring the circuit such that (1) respective plates of the third level-shift capacitor are connected to the first and third circuit nodes, (2) respective plates of the fourth level-shift capacitor are connected to the second and fourth voltage nodes, (3) respective plates of the first level-shift capacitor are connected to an output of the first circuit stage and the first differential input of the second circuit stage, and (4) respective plates of the second level-shift capacitors are connected to an output of the first circuit stage and the second differential input of the second circuit stage.

18. The method of claim 17, wherein the first and second circuit stages comprise first and second amplifier stages of an amplifier circuit.

19. The method of claim 17, wherein:

the step (d) comprises configuring the circuit during each first phase such that neither plate of either of the first and second level-shift capacitors is connected to an output of the first circuit stage; and the step (e) comprises configuring the circuit during each second phase such that neither plate of either of the third and fourth level-shift capacitors is connected to an output of the first circuit stage.

20. The method of claim 17, wherein the first circuit stage comprises a differential amplifier stage having first and second differential outputs, and wherein:

the step (d) comprises configuring the circuit during each first phase such that the respective plates of the third level-shift capacitor are connected to the first differential output of the first amplifier stage and the first differential input of the second circuit stage, and the respective plates of the fourth level-shift capacitor are connected to the second differential output of the first amplifier stage and the second differential input of the second circuit stage; and the step (e) comprises configuring the circuit during each second phase such that the respective plates of the first level-shift capacitor are connected to the first differential output of the first amplifier stage and the first differential input of the second circuit stage, and the respective plates of the second level-shift capacitor are connected to the second differential output of the first amplifier stage and the second differential input of the second circuit stage.

* * * * *